(12) United States Patent
Vansickel et al.

(10) Patent No.: US 10,667,046 B2
(45) Date of Patent: May 26, 2020

(54) MODULAR MULTICHANNEL AUDIO CONNECTION SYSTEM

(71) Applicant: Audio Accessories Group, LLC, Tempe, AZ (US)

(72) Inventors: Larry Vansickel, Phoenix, AZ (US); Wang Hai, Ningbo (CN); Gu Wendong, Ningbo (CN); Zhou Liang, Ningbo (CN)

( * ) Notice: Subject to any disclaimer, the term of this patent is extended or adjusted under 35 U.S.C. 154(b) by 0 days.

(21) Appl. No.: 16/147,689

(22) Filed: Sep. 29, 2018

(65) Prior Publication Data
US 2020/0107117 A1  Apr. 2, 2020

(51) Int. Cl.
| | |
|---|---|
| H04R 5/04 | (2006.01) |
| H03F 3/68 | (2006.01) |
| H04R 25/00 | (2006.01) |
| H01R 9/03 | (2006.01) |
| H01R 24/20 | (2011.01) |
| H04R 3/00 | (2006.01) |
| H01B 7/00 | (2006.01) |
| H03F 3/183 | (2006.01) |
| H01R 24/28 | (2011.01) |

(52) U.S. Cl.
CPC ............. *H04R 3/00* (2013.01); *H01B 7/0045* (2013.01); *H01R 24/20* (2013.01); *H01R 24/28* (2013.01); *H03F 3/183* (2013.01); *H03F 2200/03* (2013.01)

(58) Field of Classification Search
CPC ........ H01R 31/06; H01R 24/20; H01R 24/28; H01R 9/03; H01B 7/04; H01B 7/0045; H03F 3/183; H03F 2200/03; H03F 3/68; H04R 3/00; H04R 5/04; H04R 25/558; H04R 2420/03; H04N 5/4403; H04N 21/42206; H03J 1/0025
USPC ................... 381/120; 439/638, 669, 620.21; 348/734, 725; 174/72, 72 A
See application file for complete search history.

(56) References Cited

U.S. PATENT DOCUMENTS

| | | | | |
|---|---|---|---|---|
| 5,631,714 | A * | 5/1997 | Saadoun | H03G 3/3015 348/736 |
| 7,887,377 | B1 * | 2/2011 | Wallace | H01R 24/562 439/669 |
| 2009/0090551 | A1 * | 4/2009 | Cunningham | H01R 9/03 174/72 A |
| 2011/0237110 | A1 * | 9/2011 | Montena | H01R 9/0524 439/349 |
| 2012/0127373 | A1 * | 5/2012 | Ha | H04N 5/44 348/730 |
| 2013/0012041 | A2 * | 1/2013 | Krampf | H03J 1/0025 439/136 |

(Continued)

*Primary Examiner* — Vivian C Chin
*Assistant Examiner* — Ubachukwu A Odunukwe
(74) *Attorney, Agent, or Firm* — Keith L. Jenkins, Registered Patent Attorney, LLC; Keith L. Jenkins

(57) ABSTRACT

The present invention provides a system of modular wiring harnesses that provide power from the audio amplifier to the audio source. Amplifier-end modular sections of a wiring harness may be used with a variety of amplifiers of two, four, five, or six channels. Audio source-end modular sections of a wiring harness may provide connection to one of various modular amplifier-end modular wiring harnesses. Audio source-end modular sections of a wiring harness may use a signal processor to provide multiple channel outputs from single input, responsive to the connected inputs and outputs.

22 Claims, 8 Drawing Sheets

(56) References Cited

U.S. PATENT DOCUMENTS

2014/0126742 A1\* 5/2014 Eggebraaten ............ H04R 3/12
 381/80
2015/0256785 A1\* 9/2015 Barnett ................ H04N 5/4403
 348/734

\* cited by examiner

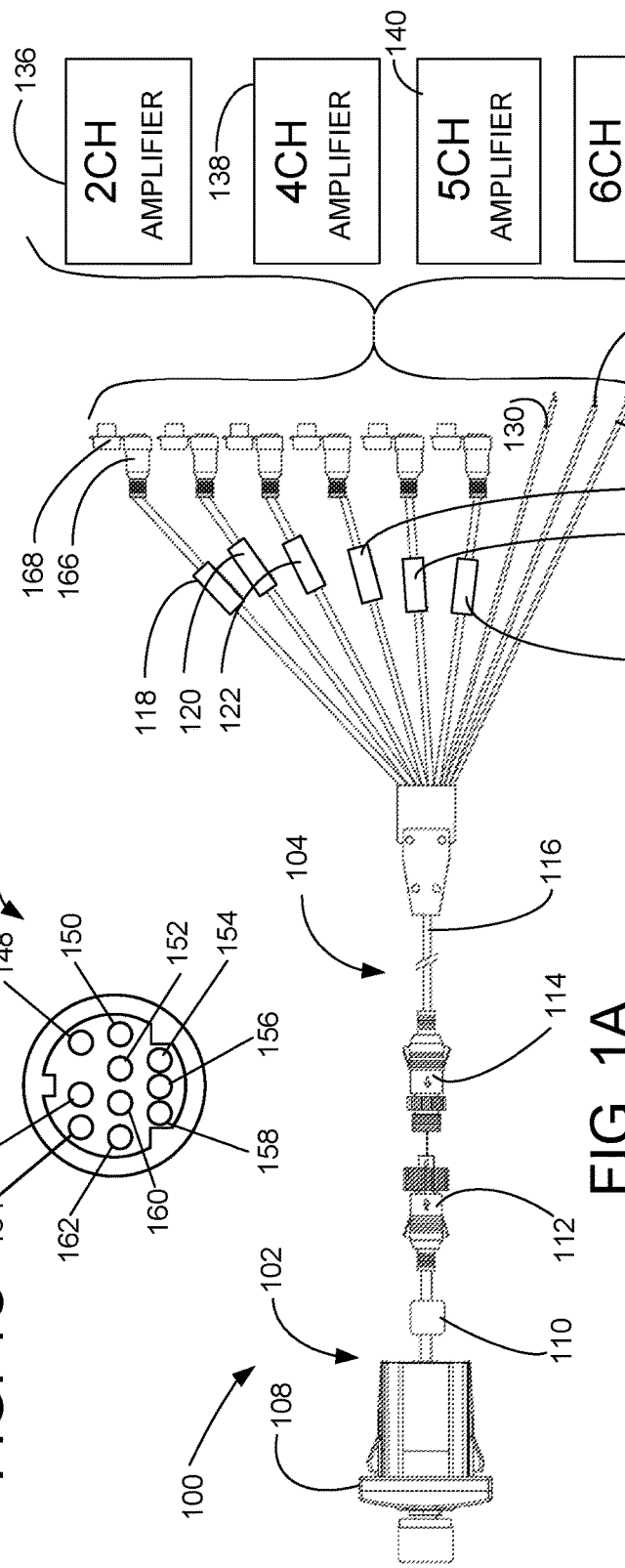
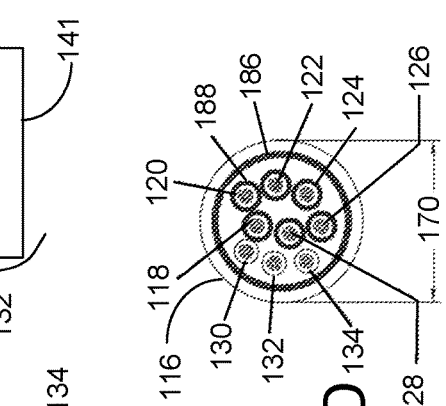
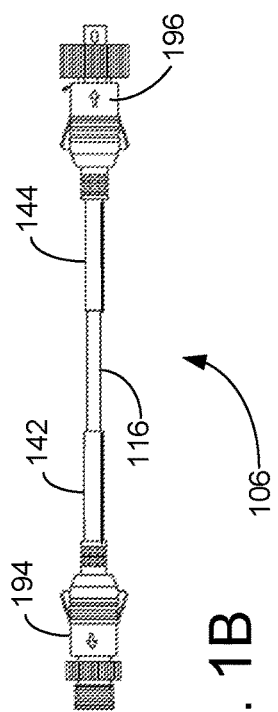
FIG. 1A
FIG. 1B
FIG. 1C
FIG. 1D

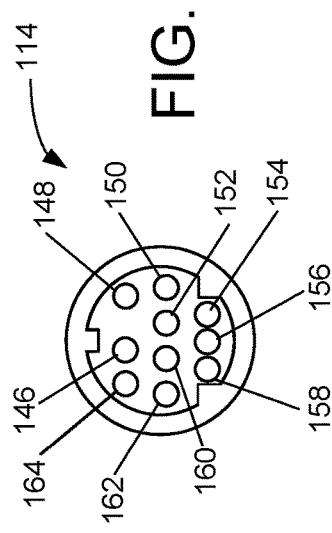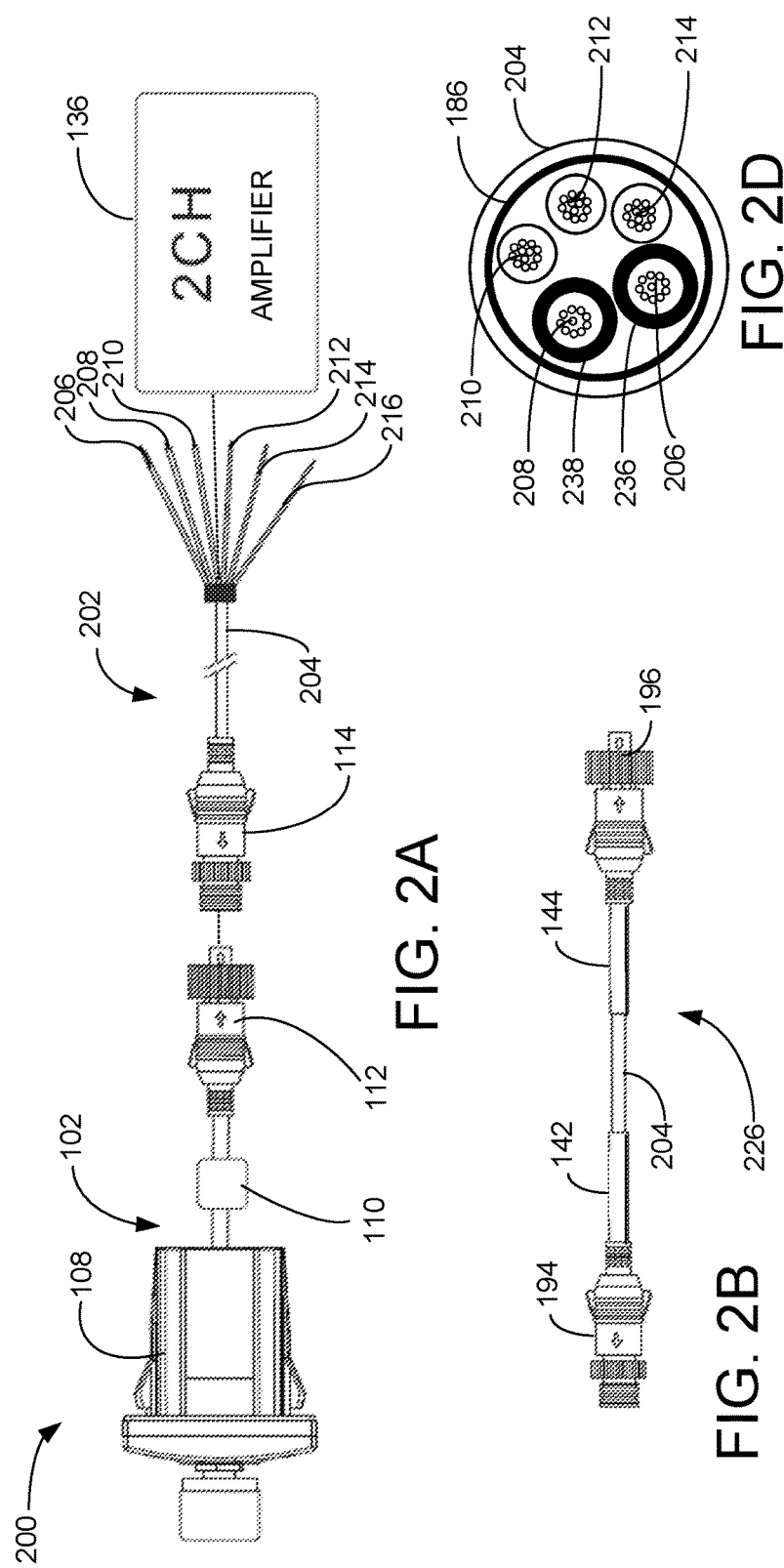

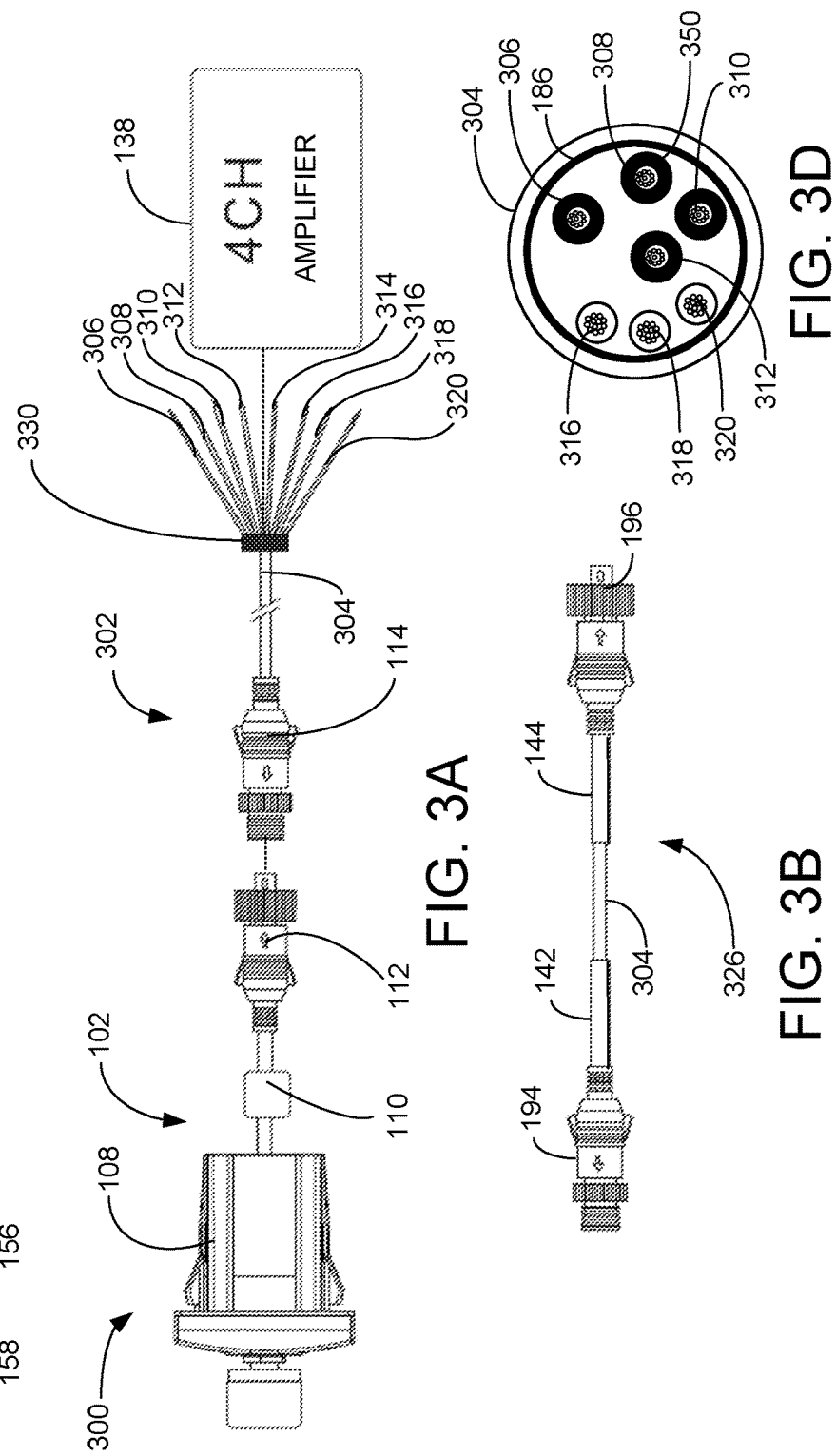
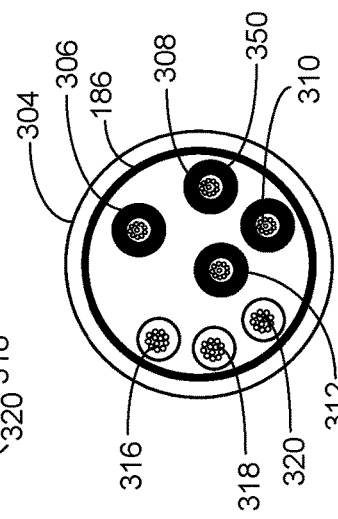
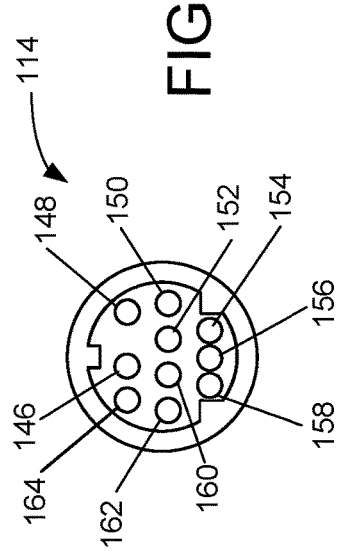
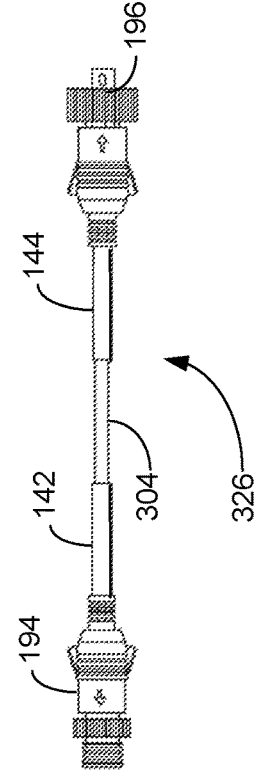
FIG. 3A
FIG. 3B
FIG. 3C
FIG. 3D

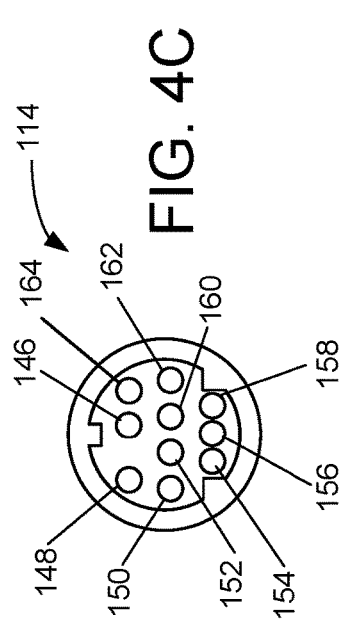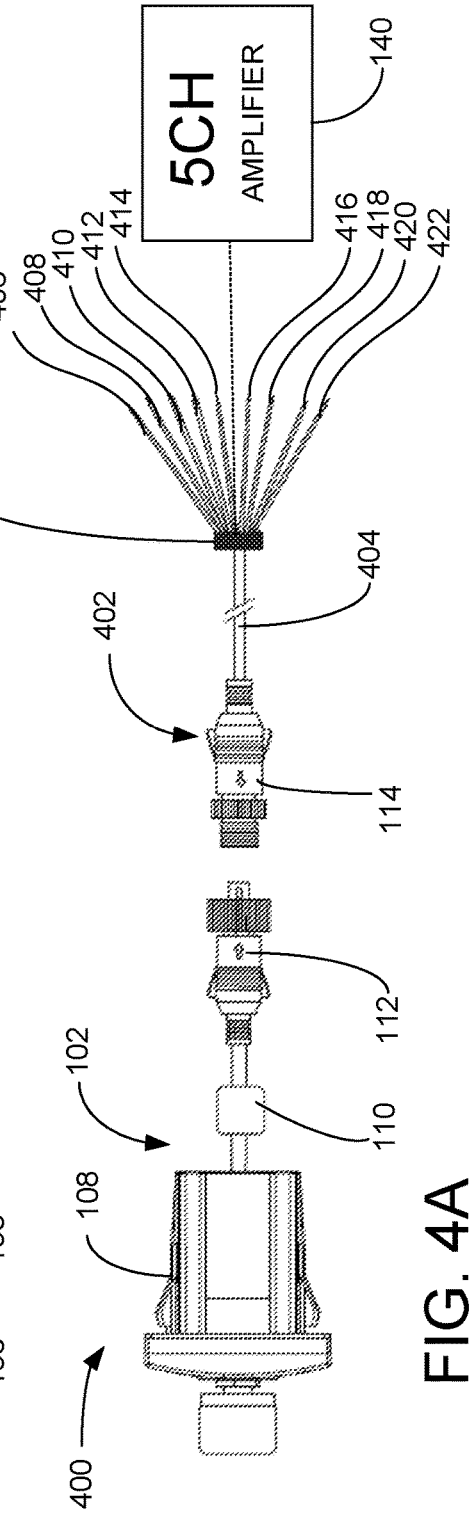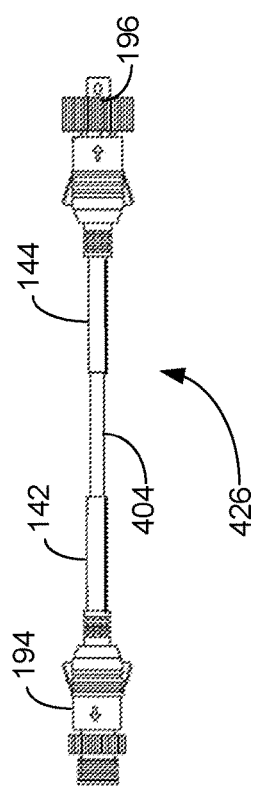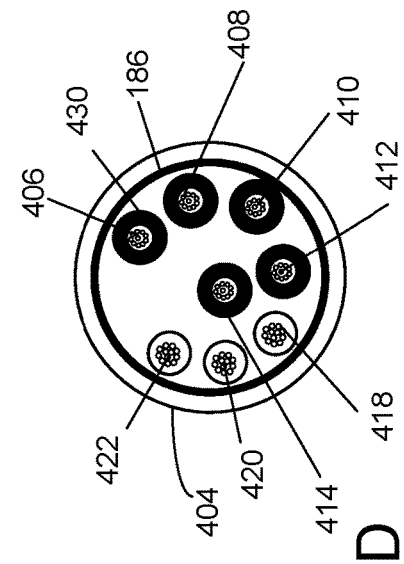
FIG. 4A
FIG. 4B
FIG. 4C
FIG. 4D

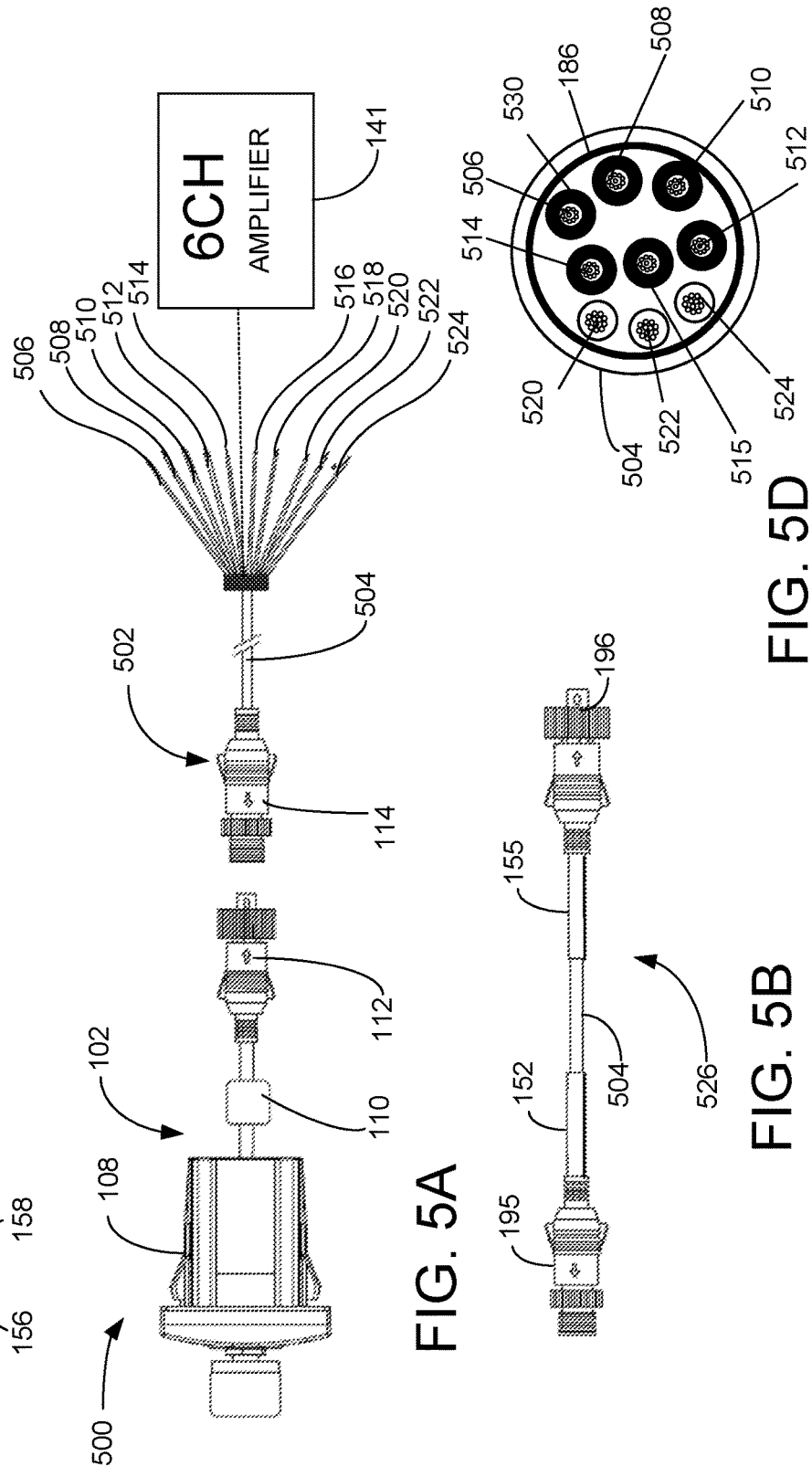

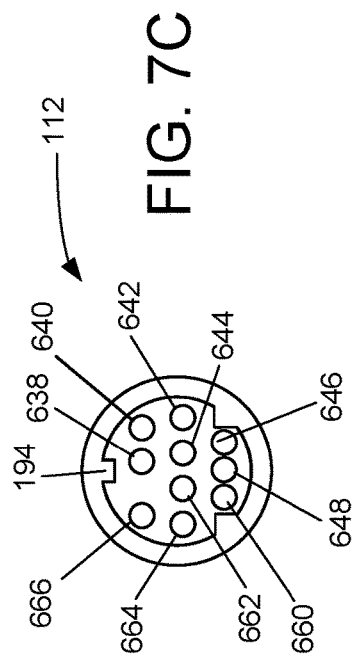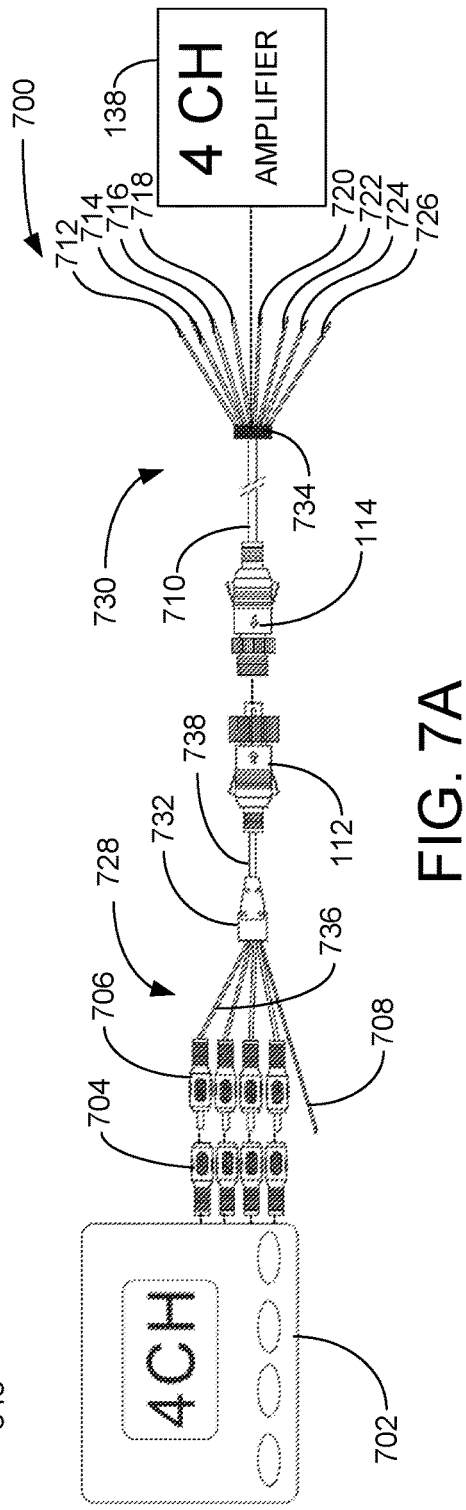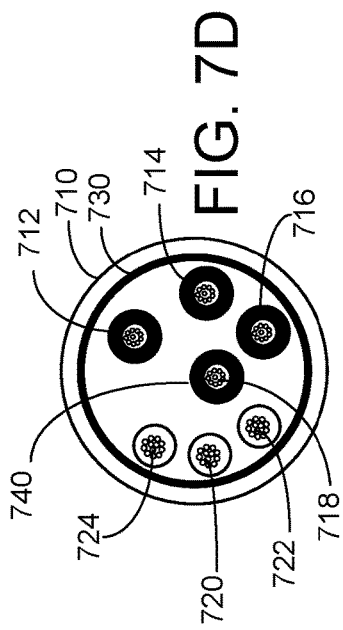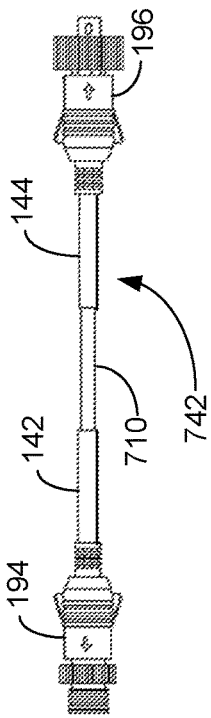

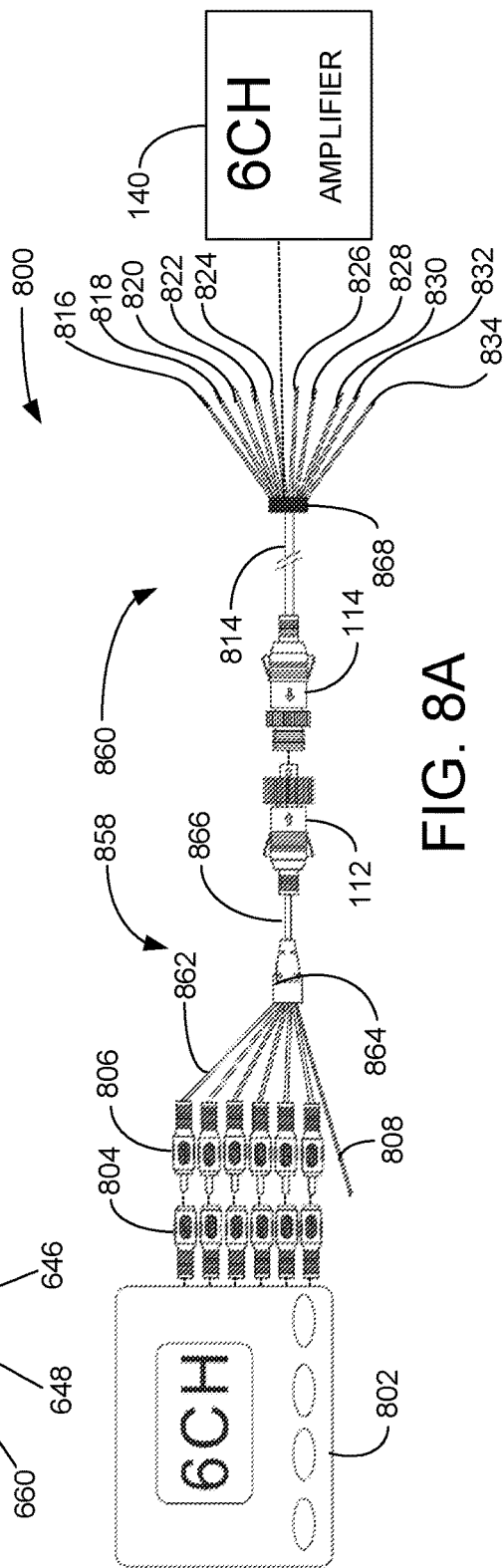
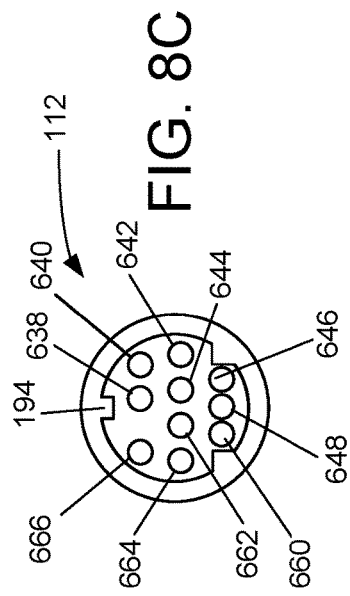
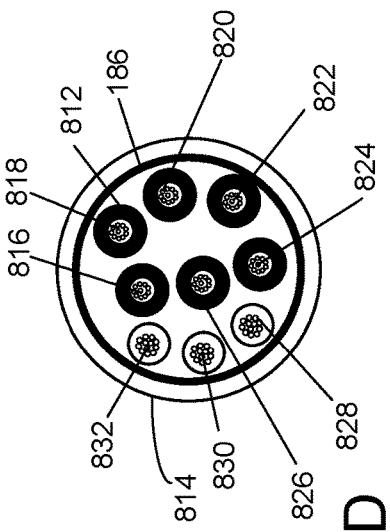
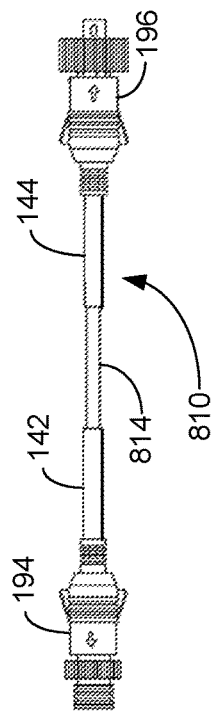
FIG. 8A
FIG. 8C
FIG. 8D
FIG. 8B

MODULAR MULTICHANNEL AUDIO CONNECTION SYSTEM

FIELD OF ART

The present invention relates to accessories for electronic audio systems. The present invention more particularly relates to a system of modular multichannel wiring harnesses that provide amplifier power to a connected audio source.

BACKGROUND OF THE INVENTION

Wiring harnesses conventionally connect each individual input to one respective output. This can limit full use of the incoming signal. Conventionally an amplifier has its own power source and an audio source has its own power source, creating expense and wiring complexity. Wiring harnesses for audio systems generally vary according to the number of channels sent by the audio source and used by the amplifier. Amplifiers are commercially available with two, four, five (also called four-point-one), and six channels.

SUMMARY OF THE INVENTION

The present invention provides a modular system of modular wiring harnesses that provide power from the audio amplifier to the audio source. Amplifier-end modular sections of a wiring harness that can be used with a variety of amplifiers of two, four, five, or six channels. Audio source-end modular sections of a wiring harness may provide connection to one of various modular amplifier-end modular wiring harnesses. Audio source-end modular sections of a wiring harness may use a signal processor to provide multiple channel outputs from single input, responsive to the connected inputs and outputs.

A modular multichannel audio connection system including: a first modular wiring harness connectable to a source of audio signals; a second modular wiring harness: connectable to an amplifier and connectable to the first modular wiring harness; where, when the first and second connected modular wiring harnesses are connected together and to the source of audio signals and to the amplifier, respectively, the first and second connected modular wiring harnesses are configured to provide electrical power from the amplifier to the source of audio signals and is operable to be the sole source of electrical power to the source of audio signals. That system, where the first modular wiring harness and the second modular wiring harness are connectable via a ten-pin male connector portion on the first modular wiring harness and a complimentary ten-pin female connector portion on the second modular wiring harness portion. That system, where the first and second connectable modular wiring harnesses, when connected, include a remote-in signal path from the source of audio signals to the amplifier. That system, further including an extension cable connectable between the first modular wiring harness and the second modular wiring harness, where the extension cable has a ten-pin female connector portion on a first end and a ten-pin male connector portion on an opposing second end. That system, including a two-channel first modular wiring harness including a signal processor that includes a signal splitter. That system, including a two-channel second modular wiring harness connectable to the two-channel first modular wiring harness and connectable to a two-channel amplifier. That system, including a four-channel second modular wiring harness connectable to the two-channel first modular wiring harness and connectable to a four-channel the amplifier, where the signal processor is responsive to the four-channel amplifier, when connected, to split the two-channel audio signals into four audio signals. That system, including one of: a five-channel second modular wiring harness connectable to the two-channel first modular wiring harness and connectable to a five-channel amplifier, where the signal processor is responsive to the five-channel amplifier, when connected, to split the two-channel audio signals into five audio signals; and a six-channel second modular wiring harness connectable to the two-channel first modular wiring harness and connectable to a six-channel amplifier, where the signal processor is responsive to the six-channel amplifier, when connected, to split the two-channel audio signals into six audio signals. That system, including: a first modular wiring harness including: two complimentary second audio signal wire connector portions coupled to respective first and second audio signal wires that are further routed into a first ferrule, enclosed in a cable, and coupled to a male ten-pin connector portion; a remote-in signal wire connectable to the audio source is further routed into the first ferrule, enclosed in the cable, and coupled to the male ten-pin connector portion; a second modular wiring harness including: a complimentary female ten-socket connector coupled to a second cable; the second cable extending from said female ten-pin connector and terminating in a second ferrule; six wires extending from the second ferrule further including: two audio signal wires; an audio ground wire; a +12 VDC wire; a ground wire for the +12 VDC; and a remote-in signal wire. That system, including: a first modular wiring harness including: four complimentary second audio signal wire connector portions coupled to first, second, third, and fourth audio signal wires extending from said female ten-pin connector and that are further routed into a first ferrule, enclosed in a cable, and coupled to a male ten-pin connector portion; a remote-in signal wire connectable to the audio source is further routed into the first ferrule, enclosed in the cable, and coupled to the male ten-pin connector portion; a second modular wiring harness including: a complimentary female ten-pin connector coupled to a second cable; the second cable terminating in a second ferrule; eight wires extending from the second ferrule further including: four audio signal wires; an audio ground wire; a +12 VDC wire; a ground wire for the +12 VDC; and a remote-in signal wire. That system, including: a first modular wiring harness including: five complimentary second audio signal wire connector portions coupled to first, second, third, fourth, fifth, and sixth audio signal wires that are further routed into a first ferrule, enclosed in a cable, and coupled to a male ten-pin connector portion; a remote-in signal wire connectable to the audio source is further routed into the first ferrule, enclosed in the cable, and coupled to the male ten-pin connector portion; a second modular wiring harness including: a complimentary female ten-pin connector coupled to a second cable; the second cable extending from said female ten-pin connector and terminating in a second ferrule; ten wires extending from the second ferrule further including: six audio signal wires; an audio ground wire; a +12 VDC wire; a ground wire for the +12 VDC; and a remote-in signal wire. That system, including: a first modular wiring harness including: six complimentary second audio signal wire connector portions coupled to first, second, third, fourth, fifth, and sixth audio signal wires that are further routed into a first ferrule, enclosed in a cable, and coupled to a male ten-pin connector portion; a remote-in signal wire connectable to the audio source is further routed into the first ferrule, enclosed in the cable, and coupled to the male ten-pin connector portion; a second modular wiring harness including: a complimentary female ten-pin connector coupled to a second cable; the second cable extending from said female ten-pin connector and terminating in a second ferrule; ten wires extending from the second ferrule further including: six audio signal wires; an audio ground wire; a +12 VDC wire; a ground wire for the +12 VDC; and a remote-in signal wire.

A modular multichannel audio connection system including: a first modular wiring harness connectable to a source of audio signals; a second modular wiring harness: connectable to the first modular wiring harness; and connectable to an amplifier; where, when the first and second connectable modular wiring harnesses are connected together and to the source of audio signals and to the amplifier, respectively, the first and second connected modular wiring harnesses are configured to provide electrical power from the amplifier to the source of audio signals and are operable to be the sole source of electrical power to the source of audio signals; where the first modular wiring harness and the second modular wiring harness are connectable via a ten-pin male connector portion on the first modular wiring harness and a complimentary ten-pin female connector portion on the second modular wiring harness; where the first and second connectable modular wiring harnesses include, when connected, a remote-in signal path from the source of audio signals to the amplifier; an extension cable connectable between the first modular wiring harness and the second modular wiring harness, where the extension cable has a ten-socket female connector portion on a first end and a ten-pin male connector portion on an opposing second end. That system, including a two-channel first modular wiring harness including a signal processor that includes a signal splitter. That system, including at least one of: a two-channel second modular wiring harness connectable to the two-channel first modular wiring harness and connectable to a two-channel the amplifier; a four-channel second modular wiring harness connectable to the two-channel first modular wiring harness and connectable to a four-channel amplifier, where, when connected, the signal processor is responsive to the four-channel amplifier to split the two-channel audio signals into four audio signals; a five-channel second modular wiring harness connectable to the two-channel first modular wiring harness and connectable to a five-channel amplifier, where, when connected, the signal processor is responsive to the five-channel amplifier to split the two-channel audio signals into five audio signals; a six-channel second modular wiring harness connectable to the two-channel first modular wiring harness and connectable to a six-channel amplifier, where, when connected, the signal processor is responsive to the six-channel amplifier to split the two-channel audio signals into six audio signals That system, including: a first modular wiring harness including: two complimentary second audio signal wire connector portions coupled to first and second audio signal wires that are further routed into a first ferrule, enclosed in a cable, and coupled to a male ten-pin connector portion; a remote-in signal wire connectable to the two-channel audio source that extends into the first ferrule, is enclosed in the cable, and is coupled to the male ten-pin connector portion; a second modular wiring harness including: a complimentary female ten-pin connector coupled to a second cable; the second cable extending from said female ten-pin connector and terminating in a second ferrule; six wires extending from the second ferrule further including: two audio signal wires; an audio ground wire; a +12 VDC wire; a ground wire for the +12 VDC; and a remote-in signal wire. That system, including: a first modular wiring harness including: four complimentary second audio signal wire connector portions coupled to first, second, third, and fourth audio signal wires that are further routed into a first ferrule, enclosed in a cable, and coupled to a male ten-pin connector portion; a remote-in signal wire connectable to the four-channel audio source that is further routed into the ferrule, enclosed in the cable, and coupled to the male ten-pin connector portion; a second modular wiring harness including: a complimentary female ten-pin connector coupled to a second cable; the second cable extending from said female ten-pin connector and terminating in a second ferrule; eight wires extending from the second ferrule further including: four audio signal wires; an audio ground wire; a +12 VDC wire; a ground wire for the +12 VDC; and a remote-in signal wire. That system, including: a first modular wiring harness including: five complimentary second audio signal wire connector portions coupled to first, second, third, fourth, and fifth audio signal wires that are further routed into a first ferrule, enclosed in a cable, and coupled to a male ten-pin connector portion; a remote-in signal wire connectable to a five-channel audio source that is further routed into the first ferrule, enclosed in the cable, and coupled to the male ten-pin connector portion; a second modular wiring harness including: a complimentary female ten-pin connector coupled to a second cable; the second cable extending from said female ten-pin connector and terminating in a second ferrule; ten wires extending from the second ferrule further including: five audio signal wires; an audio ground wire; a +12 VDC wire; a ground wire for the +12 VDC; and a remote-in signal wire. That system, including: a first modular wiring harness including: six complimentary second audio signal wire connector portions coupled to first, second, third, fourth, fifth, and sixth audio signal wires that are further routed into a first ferrule, enclosed in a cable, and coupled to a male ten-pin connector portion; a remote-in signal wire, connectable to a six-channel audio source, that is further routed into the first ferrule, enclosed in the cable, and coupled to the male ten-pin connector portion; a second modular wiring harness including: a complimentary female ten-pin connector coupled to a second cable; the second cable extending from said female ten-pin connector and terminating in a second ferrule; ten wires extending from the second ferrule further including: six audio signal wires; an audio ground wire; a +12 VDC wire; a ground wire for the +12 VDC; and a remote-in signal wire.

A modular multichannel audio connection system including: a first modular wiring harness connectable to a source of audio signals; a second modular wiring harness: connectable to the first modular wiring harness; and connectable to an amplifier; an extension cable connectable between the first modular wiring harness and the second modular wiring harness, where the extension cable has a ten-pin female connector portion on a first end and a ten-pin male connector portion on an opposing second end; where, the first and second modular wiring harnesses, when connected together and to the source of audio signals and to the amplifier, respectively, the first and second modular harnesses are configured to provide electrical power from the amplifier to the source of audio signals and are operable to be the sole conduit of electrical power to the source of audio signals; where the first modular wiring harness and the second modular wiring harness are connectable via a ten-pin male connector portion on the first modular wiring harness and a complimentary ten-socket female connector portion on the second modular wiring harness; and where the first and second harnesses, when connected together and to the source of audio signals and to the amplifier, respectively, include a remote-in signal path from the source of audio signals to the amplifier. That system, including: a two-channel first modular wiring harness including a signal processor that includes a signal splitter; and at least one of: a two-channel second modular wiring harness connectable to the two-channel first modular wiring harness and connectable to a two-channel the amplifier; a four-channel second modular wiring harness connectable to the two-channel first modular wiring harness and connectable to a four-channel amplifier, where the signal processor is responsive to the four-channel amplifier, when connected, to split the two-channel audio signals into four audio signals; a five-channel second modular wiring harness connectable to the two-channel first modular wiring harness and to a five-channel amplifier, where the signal processor is responsive to the five-channel amplifier, when connected, to split the two-channel audio signals into six audio signals; a six-channel second modular wiring harness connectable to the two-channel first modular wiring harness and connectable to a six-channel amplifier, where the signal processor is responsive, when connected, to the six-channel amplifier to split the two-channel audio signals into six audio signals. That system, including: a two-channel subsystem including: a first modular wiring harness including: two complimentary second audio signal wire connector portions coupled to first and second audio signal wires that are further routed into a first ferrule, enclosed in a cable, and coupled to a male ten-pin connector portion; a remote-in signal wire extending from the two-channel audio source that is further routed into the first ferrule, enclosed in the cable, and coupled to the male ten-pin connector portion; a second modular wiring harness including: a complimentary female ten-pin connector coupled to a second cable; the second cable terminating in a second ferrule; six wires extending from the second ferrule further including: two audio signal wires; an audio ground wire; a +12 VDC wire; a ground wire for the +12 VDC; and a remote-in signal wire; and a four-channel subsystem including: a first modular wiring harness including: four complimentary second audio signal wire connector portions coupled to first, second, third, and fourth audio signal wires that are further routed into a first ferrule, enclosed in a cable, and coupled to a male ten-pin connector portion; a remote-in signal wire connectable to the four-channel audio source that is further routed into the first ferrule, enclosed in the cable, and coupled to the male ten-pin connector portion; a second modular wiring harness including: a complimentary female ten-socket connector coupled to a second cable; the second cable extending from said female ten-pin connector and terminating in a second ferrule; eight wires extending from the ferrule further including: four audio signal wires; an audio ground wire; a +12 VDC wire; a ground wire for the +12 VDC; and a remote-in signal wire; a five-channel subsystem including: a first modular wiring harness including: five complimentary second audio signal wire connector portions coupled to first, second, third, fourth, fifth, and sixth audio signal wires that are further routed into a first ferrule, enclosed in a cable, and coupled to a male ten-pin connector portion; a remote-in signal wire connectable to the two-channel audio source that is further routed into the first ferrule, enclosed in the cable, and coupled to the male ten-pin connector portion; a second modular wiring harness including: a complimentary female ten-socket connector coupled to a second cable; the second cable extending from said female ten-pin connector and terminating in a second ferrule; nine wires extending from the second ferrule further including: five audio signal wires; an audio ground wire; a +12 VDC wire; a ground wire for the +12 VDC; and a remote-in signal wire; and a six-channel subsystem including: a first modular wiring harness including: six complimentary second audio signal wire connector portions coupled to first, second, third, fourth, fifth, and sixth audio signal wires that are further routed into a first ferrule, enclosed in a cable, and coupled to a male ten-pin connector portion; a remote-in signal wire connectable to the two-channel audio source that is further routed into the first ferrule, enclosed in the cable, and coupled to the male ten-pin connector portion; a second modular wiring harness including: a complimentary female ten-socket connector coupled to a second cable; the second cable terminating in a second ferrule; ten wires extending from the second ferrule further including: six audio signal wires; an audio ground wire; a +12 VDC wire; a ground wire for the +12 VDC; and a remote-in signal wire.

DESCRIPTION OF THE FIGURES OF THE DRAWINGS

The present invention will hereinafter be described in conjunction with the following drawing figures, wherein like numerals denote like elements, and FIG. 1A is a diagrammatic view illustrating an exemplary embodiment of a first subsystem of a modular multichannel audio connection system, according to a preferred embodiment of the present invention;

FIG. 1B is a diagrammatic view illustrating an exemplary embodiment of an extension cable for the multichannel audio connection subsystem of FIG. 1A, according to a preferred embodiment of the present invention;

FIG. 1C is a plan view illustrating an exemplary embodiment of a socket arrangement of a female connector for the multichannel audio connection subsystem of FIG. 1A, according to a preferred embodiment of the present invention;

FIG. 1D is a cross sectional view illustrating an exemplary embodiment of a cable for the multichannel audio connection subsystem of FIG. 1A, according to a preferred embodiment of the present invention;

FIG. 2A is a diagrammatic view illustrating an exemplary embodiment of a second subsystem of the modular multichannel audio connection system, according to a preferred embodiment of the present invention;

FIG. 2B is a diagrammatic view illustrating an exemplary embodiment of an extension cable for the multichannel audio connection subsystem of FIG. 2A, according to a preferred embodiment of the present invention;

FIG. 2C is a plan view illustrating an exemplary embodiment of a socket arrangement of a female connector for the multichannel audio connection subsystem of FIG. 2A, according to a preferred embodiment of the present invention;

FIG. 2D is a cross sectional view illustrating an exemplary embodiment of a cable for the multichannel audio connection subsystem of FIG. 2A, according to a preferred embodiment of the present invention;

FIG. 3A is a diagrammatic view illustrating an exemplary embodiment of a third subsystem of the modular multichannel audio connection system, according to a preferred embodiment of the present invention;

FIG. 3B is a diagrammatic view illustrating an exemplary embodiment of an extension cable for the modular multichannel audio connection system of FIG. 3A, according to a preferred embodiment of the present invention;

FIG. 3C is a plan view illustrating an exemplary embodiment of a socket arrangement of a female ten-pin connector for the multichannel audio connection subsystem of FIG. 3A, according to a preferred embodiment of the present invention;

FIG. 3D is a cross sectional view illustrating an exemplary embodiment of a cable for the multichannel audio connection subsystem of FIG. 3A, according to a preferred embodiment of the present invention;

FIG. 4A is a diagrammatic view illustrating an exemplary embodiment of a fourth subsystem of the modular multichannel audio connection system, according to a preferred embodiment of the present invention;

FIG. 4B is a diagrammatic view illustrating an exemplary embodiment of an extension cable for the multichannel audio connection subsystem of FIG. 3A, according to a preferred embodiment of the present invention;

FIG. 4C is a plan view illustrating an exemplary embodiment of a socket arrangement of a female ten-pin connector for the multichannel audio connection subsystem of FIG. 3A, according to a preferred embodiment of the present invention;

FIG. 4D is a cross sectional view illustrating an exemplary embodiment of a cable for the multichannel audio connection subsystem of FIG. 3A, according to a preferred embodiment of the present invention;

FIG. 5A is a diagrammatic view illustrating an exemplary embodiment of a fifth subsystem of the modular multichannel audio connection system, according to a preferred embodiment of the present invention;

FIG. 5B is a diagrammatic view illustrating an exemplary embodiment of an extension cable for the multichannel audio connection subsystem of FIG. 5A, according to a preferred embodiment of the present invention;

FIG. 5C is a plan view illustrating an exemplary embodiment of a socket arrangement of a female ten-pin connector for the multichannel audio connection subsystem of FIG. 5A, according to a preferred embodiment of the present invention;

FIG. 5D is a cross sectional view illustrating an exemplary embodiment of a cable for the multichannel audio connection subsystem of FIG. 5A, according to a preferred embodiment of the present invention;

FIG. 7A is a diagrammatic view illustrating an exemplary embodiment of a seventh subsystem of the modular multichannel audio connection system, according to a preferred embodiment of the present invention;

FIG. 7B is a diagrammatic view illustrating an exemplary embodiment of an extension cable for the multichannel audio connection subsystem of FIG. 7A, according to a preferred embodiment of the present invention;

FIG. 7C is a plan view illustrating an exemplary embodiment of a pin arrangement of a male ten-pin connector for the multichannel audio connection subsystem of FIG. 7A, according to a preferred embodiment of the present invention;

FIG. 7D is a cross sectional view illustrating an exemplary embodiment of a cable for the multichannel audio connection subsystem of FIG. 7A, according to a preferred embodiment of the present invention;

FIG. 8A is a diagrammatic view illustrating an exemplary embodiment of a eighth subsystem of the modular multichannel audio connection system, according to a preferred embodiment of the present invention;

FIG. 8B is a diagrammatic view illustrating an exemplary embodiment of an extension cable for the multichannel audio connection subsystem of FIG. 8A, according to a preferred embodiment of the present invention;

FIG. 8C is a plan view illustrating an exemplary embodiment of a pin arrangement of a male ten-pin connector for the multichannel audio connection subsystem of FIG. 8A, according to a preferred embodiment of the present invention; and FIG. 8D is a cross sectional view illustrating an exemplary embodiment of a cable for the multichannel audio connection subsystem of FIG. 8A, according to a preferred embodiment of the present invention.

DETAILED DESCRIPTION OF THE INVENTION

Figure 6C:
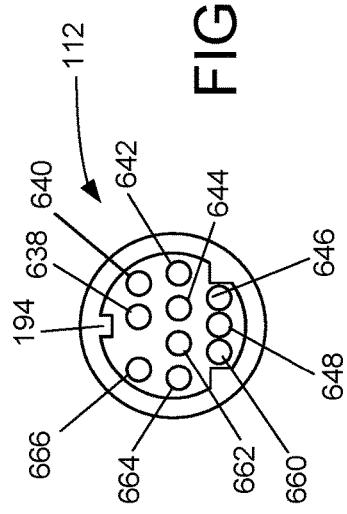
FIG. 6C is a plan view illustrating an exemplary embodiment of a pin arrangement of a male ten-pin connector for the multichannel audio connection subsystem of FIG. 6A, according to a preferred embodiment of the present invention.

The modular multichannel audio connection system is composed of eight subsystems 100, 200, 300, 400, 600, 700, and 800, as further described below. As used and defined herein, the term "audio signal wire" includes a wire, for carrying audio signals, with an insulated sheath having an external copper-winding for an audio ground. As used and defined herein, the term "female ten-pin connector" refers to a connector comprising sockets arranged to receive pins from a male ten-pin connector.

FIG. 1A is a diagrammatic view illustrating an exemplary embodiment of a first subsystem 100 of a modular multichannel audio connection system, according to a preferred embodiment of the present invention. Multichannel audio connection subsystem 100 has a modular input section 102 and a modular distribution section 104. Input section 102 includes a Bluetooth® receiver/controller (BTR) 108 in communication with signal processor 110, which is in communication with male ten-pin connector 112.

Distribution section 104 includes a female ten-pin connector 114, corresponding to male ten-pin connector 112, which is in communication with cable 116 that is in communication with audio signal wires 118, 120, 122, 124, 126, and 128 that are each wrapped with white heat shrink tubing on which is printed the correct connection point for that wire. Each audio signal wire 118, 120, 122, 124, 126, and 128 is terminated in a coupling 166 (one of six labeled) each of which has a hinged cap 168 (one of six labeled) for protecting coupling 166 when not in use. Each audio signal wire 118, 120, 122, 124, 126, and 128 has a white shrink-wrapped label identifying the channel for which it is intended. Wire 130 is the ground wire for the +12 VDC carried by wire 132 from the amplifier 136, 138, or 140, as and when connected, to the BTR 108. Powering the BTR 108 from the amplifier 136, 138, or 140 is novel approach that reduces the number of cables and the number of power sources needed to set up an audio system. Wire 134 is a remote-in wire, which carries a signal to turn on the amplifier 136, 138, 140, or 141, as and when connected, when an audio signal is present. All the wires 118, 120, 122, 124, 126, 128 130, 132, and 134 are color coded.

If audio signal wires 118 and 120 are connected to two-channel amplifier 136, then signal processor 110 will split the incoming signal from the BTR 108 into two channels for front left and front right speakers, respectively, connected (not shown) to the two-channel amplifier 136. If audio signal wires 118, 120, 122, and 124 are connected to four-channel amplifier 138, then signal processor 110 will split the incoming signal from the BTR 108 into four channels for front left, front right, rear left, and rear right speakers, respectively, connected (not shown) to the four-channel amplifier 138. If wires 118, 120, 122, 124, 126, 130, 132, and 134 are connected to six-channel amplifier 141, then signal processor 110 will split the incoming signal from the BTR 108 into six channels for front left, front center, front right, rear left, rear right, and subwoofer, respectively, connected (not shown) to the six-channel amplifier 140. If wires 118, 120, 122, 124, 126, 128, 130, 132, and 134 are connected to five-channel amplifier 141, then signal processor 110 will split the incoming signal from the BTR 108 into five channels for front left, front right, rear left, rear right, and subwoofer speakers, respectively, connected (not shown) to the five-channel amplifier 141.

FIG. 1B is a diagrammatic view illustrating an exemplary embodiment of a modular extension cable 106 for the multichannel audio connection subsystem 100 of FIG. 1A, according to a preferred embodiment of the present invention. Extension cable 106 can be used to connect input section 102 and distribution section 104. Extension cable 106 has a male ten-pin connector 196 that is similar to male ten-pin connector 112 in communication via cable 116 with female ten-pin connector 194 that is similar to female ten-pin connector 114. The illustrated length of extension cable 106 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combination may be used.

FIG. 1C is a plan view illustrating an exemplary embodiment of a socket arrangement of a female ten-pin connector 114 for the multichannel audio connection subsystem 100 of FIG. 1A, according to a preferred embodiment of the present invention. Socket 160 is for the electrical ground for +12 VDC at socket 162. Socket 164 connects the remote-in signal and the sockets 148, 150, 152, 154, 156, and 158 may carry audio signals. Socket 146 caries audio ground. In various additional embodiments, other various respective pin-outs may be used, within the constraint of complimentary connection and satisfactory function.

FIG. 1D is a cross sectional view illustrating an exemplary embodiment of a cable 116 for the multichannel audio connection subsystem 100 of FIG. 1A, according to a preferred embodiment of the present invention. Cable 116 has an inner electrically conductive metal foil layer 186 that serves as a shield and an audio ground. Wire 130 is the ground wire and wire 132 carries +12 volts DC from amplifier 136, 138, 140, or 141 to the BTR 108. Wire 134 carries the remote-in signal. Audio signal wires 118, 120, 122, 124, 126 and 128 are shielded in respective casings 188 (one of six labeled) wound with copper audio ground wires for contact with the conductive metal foil layer 186 to create a common audio ground. The diameter 180 of cable 116 is preferably approximately 6.6 millimeters.

Those of skill in the art, enlightened by the present disclosure, will understand that the first subsystem 100 of the modular multichannel audio connection system may be used with any two, four, five, or six-channel amplifier. Likewise, those of skill in the art, enlightened by the present disclosure, will understand how the first subsystem 100 of the modular multichannel audio connection system may be modified for eight-channel amplifiers.

FIG. 2A is a diagrammatic view illustrating an exemplary embodiment of a second subsystem 200 of the modular multichannel audio connection system, according to a preferred embodiment of the present invention. Multichannel audio connection subsystem 200 has an input section 102 just as in FIG. 1, and a distribution section 202. Modular input section 102 includes a BTR 108 in communication with signal processor 110, which is in communication with male ten-pin connector 112.

Modular distribution section 202 includes a female ten-pin connector 114, corresponding to male ten-pin connector 112, which is in communication with cable 204 that is in communication with wires 206, 208, 210, 212, 214 that are optionally each wrapped with portion of white heat shrink tubing on which is printed the correct connection point for that wire. Wire 212 is the ground wire for wire 214 that carries +12 volts direct current (+12 VDC) from the two-channel amplifier 136 to the BTR 108. Wire 216 is a remote-in wire, which carries a signal to turn on the two-channel amplifier 136, as and when connected, when an audio signal is present. All the wires 206, 208, 210, 212, and 214 are color coded. Wire 216 is an audio ground wire which is in electrical contact with conductive metal foil layer 186 in FIG. 2D. Audio signal wires 206 and 208 carry audio signals. Wire 210 is the audio ground wire.

When wires 206, 208, 210, 212, 214, and 216 are connected to two-channel amplifier 136, then signal processor 110 will split the incoming signal from the BTR 108 into two channels for front left and front right speakers, respectively, connected (not shown) to the two-channel amplifier 136.

FIG. 2B is a diagrammatic view illustrating an exemplary embodiment of a modular extension cable 226 for the multichannel audio connection subsystem 200 of FIG. 2A, according to a preferred embodiment of the present invention. Extension cable 226 can be used to connect input section 102 and distribution section 202. Extension cable 226 has a male ten-pin connector 196 that is similar to male ten-pin connector 112 in communication, via cable 204, with female ten-pin connector 194 that is similar to female ten-pin connector 114. The illustrated length of extension cable 226 is not a limitation of the invention. Label 142 is white shrink wrap tubing with printing that provides "TO BTR" in preferably black block letters. Label 144 is white shrink wrap tubing with printing that provides "TO AMP" in preferably black block letters. In various other embodiments, other high contrast color combinations may be used.

FIG. 2C is a plan view illustrating an exemplary embodiment of a socket arrangement of a female ten-pin connector 114 for the multichannel audio connection subsystem 200 of FIG. 2A, according to a preferred embodiment of the present invention. Sockets 152, 154, 156, and 158 receive no signals. Otherwise, the female ten-pin connector 114 for the multichannel audio connection subsystem 200 is similar to the female ten-pin connector 114 for the multichannel audio connection subsystem 100.

FIG. 2D is a cross sectional view illustrating an exemplary embodiment of a cable 204 for the multichannel audio connection subsystem 200 of FIG. 2A, according to a preferred embodiment of the present invention. Cable 204 carries wires 206, 208, 210, 212, and 214 and has an inner electrically conductive metal foil layer 186 that serves as a shield and conductor to audio ground. Wire 212 is the ground wire for the +12 volts DC carried by wire 214 from two-channel amplifier 136 to BTR 108. Wire 216 carries the remote-in signal. Audio signal wires 206 and 208 conduct audio signals and are shielded in respective spiral copper-wound casings 236 and 238.

FIG. 3A is a diagrammatic view illustrating an exemplary embodiment of a third subsystem 300 of the modular multichannel audio connection system, according to a preferred embodiment of the present invention. Multichannel audio connection subsystem 300 has an input section 102, similar to that in FIG. 1, and a distribution section 302. Modular input section 102 includes a BTR 108 in communication with signal processor 110, which is in communication with male ten-pin connector 112.

Modular distribution section 302 includes a female ten-pin connector 114, corresponding to male ten-pin connector 112, which is in communication with cable 304 that is in communication with ferrule 330 from which extend wires 306, 308, 310, 312, 314, 316, 318, and 320 that are optionally each wrapped with a label comprising a portion of white heat shrink-wrap tubing on which is printed the correct connection point for that wire. All the wires 306, 308, 310, 312, 314, 316, 318, and 320 are color coded. Audio signal wires 306, 308, 310, and 312 carry audio signals. Wire 314 carries the audio signal ground. Wire 316 carries the remote-in signal. Wire 318 carries +12 VDC from the amplifier 138 to the BTR 108. Wire 320 is the ground wire for the +12 VDC.

When wires 306, 308, 310, 312, 314, 316, 318, and 320 are connected to four-channel amplifier 138, then signal processor 110 will split the incoming signal from BTR 108 into four channels for front left, front right, rear left, and rear right speakers, respectively, connected (not shown) to the four-channel amplifier 138.

FIG. 3B is a diagrammatic view illustrating an exemplary embodiment of a modular extension cable 326 for the multichannel audio connection subsystem 300 of FIG. 3A, according to a preferred embodiment of the present invention. Extension cable 326 can be used to connect input section 102 and distribution section 302. Extension cable 326 has a male ten-pin connector 196 that is similar to male ten-pin connector 112 in communication via cable 304 with female ten-pin connector 194 that is similar to female ten-pin connector 114. The illustrated length of extension cable 326 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combinations may be used.

FIG. 3C is a plan view illustrating an exemplary embodiment of a socket arrangement of a female ten-pin connector 114 for the multichannel audio connection subsystem 300 of FIG. 3A, according to a preferred embodiment of the present invention. Sockets 156 and 158 receive no signals. Otherwise, the female ten-pin connector 114 for the multichannel audio connection subsystem 300 is similar to the female ten-pin connector 114 for the multichannel audio connection subsystem 100.

FIG. 3D is a cross sectional view illustrating an exemplary embodiment of a cable 304 for the multichannel audio connection subsystem 300 of FIG. 3A, according to a preferred embodiment of the present invention. Cable 304 carries wires 306, 308, 310, 312, 316, 318 and 320 and has an inner electrically conductive metal foil layer 186 that serves as the audio ground and is electrically connected to wire 314 extending from ferrule 330. Wire 316 carries the remote-in signal. Wire 318 carries +12 VDC from the amplifier 138 to the BTR 108. Wire 320 is the ground wire for the +12 VDC. Audio signal wires 306, 308, 310, and 312 are shielded in spiral copper-wound casings 360 (one of four labeled) and conduct audio signals.

FIG. 4A is a diagrammatic view illustrating an exemplary embodiment of a fourth subsystem 400 of the modular multichannel audio connection system, according to a preferred embodiment of the present invention. Multichannel audio connection subsystem 400 has an input section 102, similar to that in FIG. 1, and a distribution section 402. Modular input section 102 includes a BTR 108 in communication with signal processor 110, which is in communication with male ten-pin connector 112.

Modular distribution section 402 includes a female ten-pin connector 114, corresponding to male ten-pin connector 112, which is in communication with cable 404 that is in communication with ferrule 440 from which extend wires 406, 408, 410, 412, 414, 416, 418, 420, and 422 that are optionally each wrapped with a label comprising a portion of white heat shrink-wrap tubing on which is printed the correct connection point for that wire. All the wires 406, 408, 410, 412, 414, 416, 418, 420, and 422 and are color coded. Wires 406, 408, 410, 412, and 414 carry audio signals. Wire 416 extends from ferrule 440 and carries the audio signal ground from conductive metal foil layer 186. Wire 418 carries +12 VDC from the amplifier 148 to the BTR 108. Wire 420 is the ground wire for the +12 VDC. Wire 422 carries the remote-in signal.

When wires 406, 408, 410, 412, 414, 416, 418, 420, and 422 are connected to five-channel amplifier 140, then signal processor 110 will split the incoming signal from BTR 108 into five channels for front left, front right, rear left, rear right, and subwoofer speakers, respectively, connected (not shown) to the five-channel amplifier 140.

FIG. 4B is a diagrammatic view illustrating an exemplary embodiment of a modular extension cable 426 for the multichannel audio connection subsystem 400 of FIG. 4A, according to a preferred embodiment of the present invention. Extension cable 426 can be used to connect input section 102 to distribution section 402. Extension cable 426 has a male ten-pin connector 196 that is similar to male ten-pin connector 112 in communication via cable 404 with female ten-pin connector 194 that is similar to female ten-pin connector 114. The illustrated length of extension cable 426 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combinations may be used.

FIG. 4C is a plan view illustrating an exemplary embodiment of a socket arrangement of a female ten-pin connector 114 for the multichannel audio connection subsystem 400 of FIG. 4A, according to a preferred embodiment of the present invention. Socket 158 carries no signal. Otherwise, the female ten-pin connector 114 for the multichannel audio connection subsystem 400 is similar to the female ten-pin connector 114 for the multichannel audio connection subsystem 100. Socket 164 connects the remote-in signal and the sockets 148, 150, 152, 154, and 156 carry audio signals. Socket 146 caries audio ground. In various additional embodiments, other various respective pin-outs may be used, within the constraint of complimentary connection and satisfactory function.

FIG. 4D is a cross sectional view illustrating an exemplary embodiment of a cable 404 for the multichannel audio connection subsystem 400 of FIG. 4A, according to a preferred embodiment of the present invention. Cable 404 carries wires 406, 408, 410, 412, 416, 418 and 420 and has an inner electrically conductive metal foil layer 186 that serves as the audio ground and is electrically connected to wire 414 extending from ferrule 440. Wire 416 carries the remote-in signal. Wire 418 carries +12 VDC from the amplifier 148 to the BTR 108. Wire 420 is the ground wire for the +12 VDC.

Audio signal wires 406, 408, 410, and 412 are shielded in spiral copper-wound casings 460 (one of four labeled) and conduct audio signals.

FIG. 5A is a diagrammatic view illustrating an exemplary embodiment of a fifth subsystem 500 of the modular multichannel audio connection system, according to a preferred embodiment of the present invention. Multichannel audio connection subsystem 500 has an input section 102 and a distribution section 502. Modular input section 102 includes a BTR 108 in communication with signal processor 110, which is in communication with male ten-pin connector 112. The advantage of using input section 102 in subsystems 100, 200, 300, 400, and 500 is that it lowers part counts and part stocking costs. The advantage of using of ten-pin connectors 112, 114, 194, and 196, even for harnesses that do not use all ten pins, reduces part-type counts and part stocking costs.

Modular distribution section 502 includes a female ten-pin connector 114, corresponding to male ten-pin connector 112, which is in communication with cable 504 that is in communication with wires 506, 508, 510, 512, 514, 516, 520, 522, and 524 that are optionally each wrapped with white heat shrink tubing on which is printed the correct connection point for that wire. All the wires 506, 508, 510, 512, 514, 516, 520, 522, and 524 are color coded. Wires 506, 508, 510, 512, 514, 516 carry audio signals. Wire 518 is an audio ground wire that is in electrical connection with conductive metal foil layer 186, as shown in FIG. 5D. Wire 520 is the ground wire for the +12 VDC carried by wire 522 from the six-channel amplifier 141 to the BTR 108.

When wires 506, 508, 510, 512, 514, 516, 518, 520, 522, and 524 are connected to six-channel amplifier 141, then signal processor 110 will split the incoming signal from the BTR 108 into six channels for front left, front center, front right, rear left, rear right, and subwoofer speakers, respectively, connected (not shown) to the six-channel amplifier 141.

FIG. 5B is a diagrammatic view illustrating an exemplary embodiment of a modular extension cable 526 for the multichannel audio connection subsystem 500 of FIG. 5A, according to a preferred embodiment of the present invention. Extension cable 526 can be used to connect input section 102 to distribution section 502. Extension cable 526 has a male ten-pin connector 196 that is similar to male ten-pin connector 112 in communication via cable 504 with female ten-pin connector 194 that is similar to female ten-pin connector 114. The illustrated length of extension cable 526 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combination may be used.

FIG. 5C is a plan view illustrating an exemplary embodiment of a socket arrangement of a female ten-pin connector 114 for the multichannel audio connection subsystem 500 of FIG. 5A, according to a preferred embodiment of the present invention. The female ten-pin connector 114 for the multichannel audio connection subsystem 300 is similar to the female ten-pin connector 114 for the modular multichannel audio connection system 100. Socket 160 is for the electrical ground for +12 VDC at socket 162. Socket 164 connects the remote-in signal and the sockets 148, 150, 152, 154, 156, and 158 carry audio signals. In various additional embodiments, other various respective pin-outs may be used, within the constraint of complimentary connection and satisfactory function.

FIG. 5D is a cross sectional view illustrating an exemplary embodiment of a cable 504 for the multichannel audio connection subsystem 500 of FIG. 5A, according to a preferred embodiment of the present invention. Cable 504 carries wires 506, 508, 510, 512, 514, 516, 520, 520, 522, and 524 and has an inner electrically conductive metal foil layer 186 that electrically connects to wire 518 as the audio ground wire. Wire 528 carries the remote-in signal. Wires 506, 508, 510, 512, 514, and 516 conduct audio signals and are shielded in copper-wound spiral casings 530 (one of six labeled).

The common use of input section 102 for subsystems 100, 200, 300, 400, and 500 is a point of novelty of the present invention and has the advantage of reducing the number of part types and reducing stocking costs. The use of ten-pin connectors 112, 114, 194, and 196, even for harnesses that do not use all ten pins is a point of novelty of the present invention and advantageously reduces part-type counts and part stocking costs. Powering the audio source from the amplifier is a point of novelty of the present invention and advantageously reduces the need for an independent source of power for the audio source, such as BTR 108.

Figure 6A:
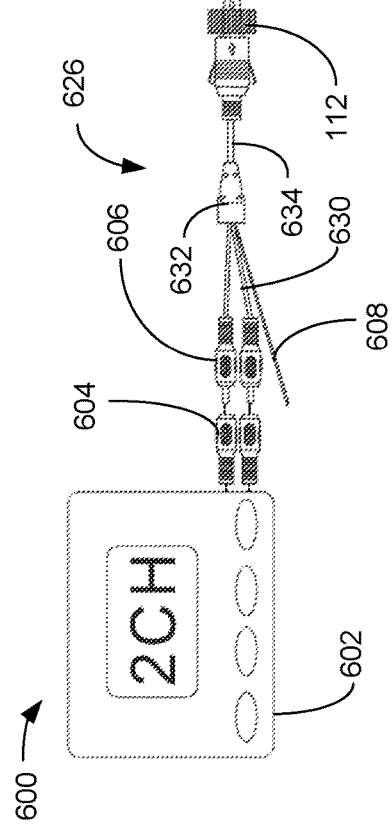
FIG. 6A is a diagrammatic view illustrating an exemplary embodiment of a sixth subsystem of the modular multichannel audio connection system, according to a preferred embodiment of the present invention.

FIG. 6A is a diagrammatic view illustrating an exemplary embodiment of a sixth subsystem 600 of the modular multichannel audio connection system, according to a preferred embodiment of the present invention. Subsystem 600 includes a two-channel audio source 602 supporting audio signal wire connectors 604 (one of two labeled), a modular source harness 626, modular amplifier harness 628, and a two-channel amplifier 136. Audio signal wire connector portions 604 are preferably female RCA audio connectors 604. Source harness 626 includes two male audio connectors 606 (one of two labeled) each connected by two-wire audio signal cables 630 (one of two labeled) into ferrule 632. Remote-in wire 608 also enters ferrule 632. Cable 634 extends from ferrule 632 and encloses two-wire audio signal cables 630 and remote-in wire 608. Cable 634 extends to male ten-pin connector 112.

Figure 6B:
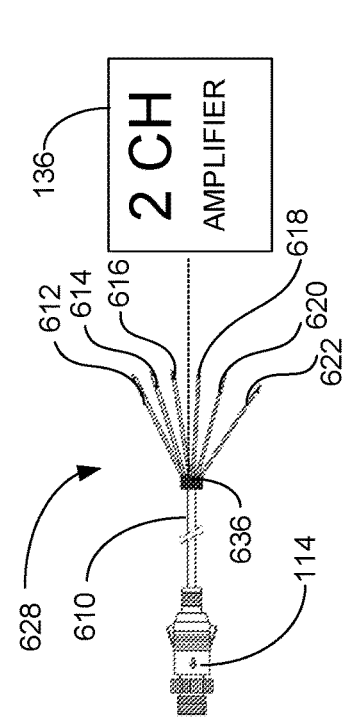
FIG. 6B is a diagrammatic view illustrating an exemplary embodiment of an extension cable for the multichannel audio connection subsystem of FIG. 6A, according to a preferred embodiment of the present invention.
Figure 6D:
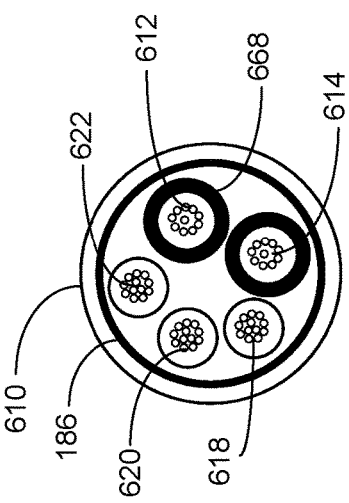
FIG. 6D is a cross sectional view illustrating an exemplary embodiment of a cable for the multichannel audio connection subsystem of FIG. 6A, according to a preferred embodiment of the present invention.

Modular amplifier harness 628 has female ten-pin connector 114 from which cable 610 extends to ferrule 636, from which extend audio wires 612 and 614, ground wire 616 for +12 VDC carried by wire 618 from two-channel amplifier 136 toward two-channel audio source 602, remote-in wire 622, and audio ground wire 620 which is in electrical connection with electrically conductive metal foil layer 186 of cable 610, as shown in FIG. 6D. When wires 612, 614, 616, 618, 620, and 622 are connected to two-channel amplifier 136, audio signals from two-channel audio source 602 will be amplified; two-channel audio source 602 will be powered by +12 VDC from the two-channel amplifier 136; and detected audio from connection of remote-in wire 608 connected to two-channel audio source 602 will trigger the two-channel amplifier 136 to begin amplifying audio signals. Of course, the +12 VDC power supply in the two-channel amplifier 136 must be on before the amplifying channels, in order to supply power to the two-channel audio source 602 so that the remote-in signal can be sent to the amplifier 136 on wire 622.

FIG. 6B is a diagrammatic view illustrating an exemplary embodiment of a modular extension cable 624 for the multichannel audio connection subsystem 600 of FIG. 6A, according to a preferred embodiment of the present invention. Extension cable 624 has a male ten-pin connector 196 that is similar to male ten-pin connector 112 in communication via cable 610 with female ten-pin connector 194 that is similar to female ten-pin connector 114. The illustrated length of extension cable 624 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combination may be used.

FIG. 6C is a plan view illustrating an exemplary embodiment of a pin arrangement of a male ten-pin connector 112 for the multichannel audio connection subsystem 600 of FIG. 6A, according to a preferred embodiment of the present invention. Pins 638, 640, 648, 660 and 666 carry no signals. Pin 646 carries the remote-in signal. Pin 662 is the ground pin for the +12 VDC carried on pin 664 to two-channel audio source 602. Pins 642 and 644 carry audio signals. In various other embodiments, pin assignments may vary within the constraint that the pin assignments are consistent throughout the sixth audio harness subsystem 600.

FIG. 6D is a cross sectional view illustrating an exemplary embodiment of a cable 610 for the modular multichannel audio connection system 600 of FIG. 6A, according to a preferred embodiment of the present invention. Wires 612 and 614 carry audio signals and are wrapped within a copper-wound cable shield 668 (one of two labeled). Wire 620 is the ground for the +12 VDC carried by wire 622 from two-channel amplifier 136 toward two-channel audio source 602. Wire 618 is the remote-in signal wire. Electrically conductive metal foil layer 186 is in electrical contact with the copper-wound spiral cable shields 668. Wire 616 is electrically connected to the copper-wound spiral cable shields 668 which serves as an audio ground.

FIG. 7A is a diagrammatic view illustrating an exemplary embodiment of a seventh subsystem 700 of the modular multichannel audio connection system, according to a preferred embodiment of the present invention. Seventh multichannel audio connection subsystem 700 includes a four-channel audio source 702 with audio signal wire connectors 704 (one of four labeled), a modular source harness 728, modular amplifier harness 730, and a four-channel amplifier 138. Audio signal wire connectors 704 are preferably female RCA audio signal wire connectors 704. Source harness 728 includes four male audio connectors 706 (one of four labeled) each connected by wire audio signal wires 736 (one of four labeled) into ferrule 732. Remote-in wire 708 also enters ferrule 732. Cable 738 extends from ferrule 732 and encloses audio signal wires 736 (one of four labeled) and remote-in wire 708. Cable 738 extends to male ten-pin connector 112.

Amplifier harness 730 has female ten-pin connector 114 from which cable 710 extends to ferrule 734, from which extend audio wires 712, 714, 716, and 718, ground wire 720 for +12 VDC carried by wire 722 from four-channel amplifier 138 toward four-channel audio source 702, remote-in wire 708, and audio ground wire 726 which is in electrical connection with electrically conductive metal foil layer 186 of cable 710, as shown in FIG. 7D. When wires 712, 714, 716, 718, 720, 722, 724, and 726 are connected to four-channel amplifier 138, audio signals from four-channel audio source 702 will be amplified; four-channel audio source 702 will be powered by +12 VDC from the four-channel amplifier 138; and detected audio from connection of remote-in wire 708 connected to four-channel audio source 702 will trigger the four-channel amplifier 138 to begin amplifying audio signals. Of course, the +12 VDC power supply in the four-channel amplifier 138 must be on before the amplifying channels, in order to supply power to the four-channel audio source 702 so that the remote-in signal can be sent.

FIG. 7B is a diagrammatic view illustrating an exemplary embodiment of a modular extension cable 742 for the multichannel audio connection subsystem 700 of FIG. 7A, according to a preferred embodiment of the present invention. Extension cable 742 has a male ten-pin connector 196, that is similar to male ten-pin connector 112, in communication via cable 710 with female ten-pin connector 194 that is similar to female ten-pin connector 114. The illustrated length of extension cable 742 is not a limitation of the invention. Label 142 is white shrink wrap with printing that provides "TO BTR" in preferably black block letters. Label 144 is white shrink wrap with printing that provides "TO AMP" in preferably black block letters. In various other embodiments, other high contrast color combination may be used.

FIG. 7C is a plan view illustrating an exemplary embodiment of a pin arrangement of a male ten-pin connector 112 for the multichannel audio connection subsystem 700 of FIG. 7A, according to a preferred embodiment of the present invention. Pins 648, 660 and 666 carry no signals. Pin 646 carries the remote-in signal. Pin 662 is the ground pin for the +12 VDC carried on pin 664 toward four-channel audio source 702. Pins 638, 640, 642, and 664 carry audio signals. In various other embodiments, pin assignments may vary within the constraint that the pin assignments are consistent throughout the multichannel audio connection subsystem 700.

FIG. 7D is a cross sectional view illustrating an exemplary embodiment of a cable 710 for the multichannel audio connection subsystem 700 of FIG. 7A, according to a preferred embodiment of the present invention. Audio wires 712, 714, 716, and 718 carry audio signals and are wrapped within a copper-wound cable shield 740 (one of four labeled). Wire 720 is the ground for the +12 VDC carried by wire 722 from four-channel amplifier 138 toward four-channel audio source 702. Wire 724 is the remote-in signal wire. Electrically conductive metal foil layer 186 is in electrical contact with the copper-wound spiral cable shields 740. Wire 726 is electrically connected by physical contact to the copper-wound spiral cable shields 740 which serves as an audio ground.

FIG. 8A is a diagrammatic view illustrating an exemplary embodiment of an eighth subsystem 800 of the modular multichannel audio connection system, according to a preferred embodiment of the present invention. Eighth multichannel audio connection subsystem 800 includes six-channel audio source 802 with audio signal wire connectors 804 (one of six labeled), a modular source harness 868, modular amplifier harness 860, and a six-channel amplifier 140. Audio signal wire connectors 804 are preferably female RCA audio connector portions 804. Source harness 868 includes six male audio connector portions 806 (one of six labeled) each connected by audio signal wires 862 (one of six labeled) into ferrule 864. Remote-in wire 808 also enters ferrule 864. Cable 866 extends from ferrule 864 and encloses wires 863 and remote-in wire 808. Cable 866 extends to male ten-pin connector 112.

A modular amplifier harness 860 has female ten-pin connector 114 from which cable 814 extends to ferrule 868, from which extend audio wires 816, 818, 820, 822, 824, and 826; ground wire 828 for +12 VDC carried by wire 830 from six-channel amplifier 140 toward six-channel audio source 802; and remote-in wire 832. Audio ground wire 834 is in electrical connection with electrically conductive metal foil layer 186 of cable 814, as shown in FIG. 8D. When wires 816, 818, 820, 822, 824, 826, 828, 830, 832, and 834 are connected to five channel amplifier 140, audio signals from six-channel audio source 802 will be amplified; multichannel audio connection six-channel audio source 802 will be powered by +12 VDC from the five channel amplifier 140; and detected audio from connection of remote-in wire 808 connected to six-channel audio source 802 will trigger the six-channel amplifier 140 to begin amplifying audio signals. Of course, the +12 VDC power supply in the six-channel amplifier 140 must be on before the amplifying channels, in order to supply power to the six-channel audio source 802 so that the remote-in signal can be sent.

FIG. 8B is a diagrammatic view illustrating an exemplary embodiment of a modular extension cable 810 for the multichannel audio connection subsystem 800 of FIG. 8A, according to a preferred embodiment of the present invention. Extension cable 810 has a male ten-pin connector 196, that is similar to male ten-pin connector 112, in communication via cable 814 with female ten-pin connector 194 that is similar to female ten-pin connector 114. The illustrated length of extension cable 810 is not a limitation of the invention. Label 142 is preferably white shrink-wrap tubing with printing that provides "TO BTR" in preferably black block letters. Label 144 is white shrink-wrap tubing with printing that provides "TO AMP" in preferably black block letters. In various other embodiments, other high contrast color combination may be used.

FIG. 8C is a plan view illustrating an exemplary embodiment of a pin arrangement of a male ten-pin connector 112 for the modular multichannel audio connection system 800 of FIG. 8A, according to a preferred embodiment of the present invention. Pin 666 carries no signal. Pin 646 carries the remote-in signal. Pin 662 is the ground pin for the +12 VDC carried on pin 664 toward six-channel audio source 802. Pins 638, 640, 642, 644, 648, and 660 carry audio signals. In various other embodiments, pin assignments may vary within the constraint that the pin assignments are consistent throughout the seventh audio multichannel audio connection subsystem 800.

FIG. 8D is a cross sectional view illustrating an exemplary embodiment of a cable 814 for the multichannel audio connection subsystem 800 of FIG. 8A, according to a preferred embodiment of the present invention. Wires 816, 818, 820, 822, 824, and 826 carry audio signals and are wrapped within a copper-wound cable shield 812 (one of six labeled). Wire 828 is the ground for the +12 VDC carried by wire 830 from six-channel amplifier 140 toward six-channel audio source 802. Wire 832 is the remote-in signal wire. Electrically conductive metal foil layer 186 is in electrical and physical contact with the copper-wound spiral cable shields 812. Wire 834 is electrically connected to the electrically conductive metal foil layer 186 which serves as an audio ground.

Those of skill in the art, enlightened by the present disclosure, will understand how to modify the multichannel audio connection subsystem 800 for a five-channel system.

The claims below contain functional claiming and do not contain statements of intended use.

We claim:

1. A modular multichannel audio connection system comprising:
    a. a first modular wiring harness connectable to a source of audio signals;
    b. a second modular wiring harness:
        i. connectable to an amplifier; and
        ii. connectable to said first modular wiring harness; and
    c. wherein, when said first and second connected modular wiring harnesses are connected together and to said source of audio signals and to said amplifier, respectively, said first and second connected modular wiring harnesses are configured to provide electrical power from said amplifier to said source of audio signals and is operable to be the sole source of electrical power to said source of audio signals.

2. The system of claim 1, wherein said first modular wiring harness and said second modular wiring harness are connectable via a ten-pin male connector portion on said first modular wiring harness and a complimentary ten-pin female connector portion on said second modular wiring harness portion.

3. The system of claim 2, wherein said first and second connectable modular wiring harnesses, when connected, comprise a remote-in signal path from said source of audio signals to said amplifier.

4. The system of claim 3, further comprising an extension cable connectable between said first modular wiring harness and said second modular wiring harness, wherein said extension cable has a ten-pin female connector portion on a first end and a ten-pin male connector portion on an opposing second end.

5. The system of claim 3, comprising a two-channel first modular wiring harness comprising a signal processor that comprises a signal splitter.

6. The system of claim 5, comprising a two-channel said second modular wiring harness connectable to said two-channel first modular wiring harness and connectable to a two-channel said amplifier.

7. The system of claim 5, comprising a four-channel said second modular wiring harness connectable to said two-channel first modular wiring harness and connectable to a four-channel said amplifier, wherein said signal processor is responsive to said four-channel amplifier, when connected, to split said two-channel audio signals into four audio signals.

8. The system of claim 5, comprising one of:
    a. a five-channel said second modular wiring harness connectable to said two-channel first modular wiring harness and connectable to a five-channel said amplifier, wherein said signal processor is responsive to said five-channel amplifier, when connected, to split said two-channel audio signals into five audio signals; and
    b. a six-channel said second modular wiring harness connectable to said two-channel first modular wiring harness and connectable to a six-channel said amplifier, wherein said signal processor is responsive to said six-channel amplifier, when connected, to split said two-channel audio signals into six audio signals.

9. The system of claim 1, comprising:
a. a first modular wiring harness comprising:
   i. two complimentary second audio signal wire connector portions coupled to respective first and second audio signal wires that are further routed into a first ferrule, enclosed in a cable, and coupled to a male ten-pin connector portion; and
   ii. a remote-in signal wire connectable to said audio source is further routed into said first ferrule, enclosed in said cable, and coupled to said male ten-pin connector portion; and
b. a second modular wiring harness comprising:
   i. a complimentary female ten-socket connector coupled to a second cable;
   ii. said second cable extending from said female ten-pin connector and terminating in a second ferrule; and
   iii. six wires extending from said second ferrule further comprising:
      1. two audio signal wires;
      2. an audio ground wire;
      3. a +12 VDC wire;
      4. a ground wire for said +12 VDC; and
      5. a remote-in signal wire.

10. The system of claim 1, comprising:
a. a first modular wiring harness comprising:
   i. four complimentary second audio signal wire connector portions coupled to first, second, third, and fourth audio signal wires that are further routed into a first ferrule, enclosed in a cable, and coupled to a male ten-pin connector portion; and
   ii. a remote-in signal wire connectable to said audio source is further routed into said first ferrule, enclosed in said cable, and coupled to said male ten-pin connector portion; and
b. a second modular wiring harness comprising:
   i. a complimentary female ten-pin connector coupled to a second cable;
   ii. said second cable extending from said female ten-pin connector and terminating in a second ferrule; and
   iii. eight wires extending from said second ferrule further comprising:
      1. four audio signal wires;
      2. an audio ground wire;
      3. a +12 VDC wire;
      4. a ground wire for said +12 VDC; and
      5. a remote-in signal wire.

11. The system of claim 1, comprising:
a. a first modular wiring harness comprising:
   i. five complimentary second audio signal wire connector portions coupled to first, second, third, fourth, fifth, and sixth audio signal wires that are further routed into a first ferrule, enclosed in a cable, and coupled to a male ten-pin connector portion; and
   ii. a remote-in signal wire connectable to said audio source is further routed into said first ferrule, enclosed in said cable, and coupled to said male ten-pin connector portion; and
b. a second modular wiring harness comprising:
   i. a complimentary female ten-pin connector coupled to a second cable;
   ii. said second cable extending from said female ten-pin connector and terminating in a second ferrule; and
   iii. nine wires extending from said second ferrule further comprising:
      1. five audio signal wires;
      2. an audio ground wire;
      3. a +12 VDC wire;
      4. a ground wire for said +12 VDC; and
      5. a remote-in signal wire.

12. The system of claim 1, comprising:
a. a first modular wiring harness comprising:
   i. six complimentary second audio signal wire connector portions coupled to first, second, third, fourth, fifth, and sixth audio signal wires that are further routed into a first ferrule, enclosed in a cable, and coupled to a male ten-pin connector portion; and
   ii. a remote-in signal wire connectable to said audio source is further routed into said first ferrule, enclosed in said cable, and coupled to said male ten-pin connector portion; and
b. a second modular wiring harness comprising:
   i. a complimentary female ten-pin connector coupled to a second cable;
   ii. said second cable extending from said female ten-pin connector and terminating in a second ferrule; and
   iii. ten wires extending from said second ferrule further comprising:
      1. six audio signal wires;
      2. an audio ground wire;
      3. a +12 VDC wire;
      4. a ground wire for said +12 VDC; and
      5. a remote-in signal wire.

13. A modular multichannel audio connection system comprising:
a. a first modular wiring harness connectable to a source of audio signals;
b. a second modular wiring harness:
   i. connectable to said first modular wiring harness; and
   ii. connectable to an amplifier;
c. wherein, when said first and second connected modular wiring harnesses are connected together and to said source of audio signals and to said amplifier, respectively, said first and second connected modular wiring harnesses are configured to provide electrical power from said amplifier to said source of audio signals and are operable to be the sole source of electrical power to said source of audio signals;
d. wherein said first modular wiring harness and said second modular wiring harness are connectable via a ten-pin male connector portion on said first modular wiring harness and a complimentary ten-pin female connector portion on said second modular wiring harness;
e. wherein said first and second connectable modular wiring harnesses comprise, when connected, a remote-in signal path from said source of audio signals to said amplifier; and
f. an extension cable connectable between said first modular wiring harness and said second modular wiring harness, wherein said extension cable has a ten-socket female connector portion on a first end and a ten-pin male connector portion on an opposing second end.

14. The system of claim 13, comprising a two-channel first modular wiring harness comprising a signal processor that comprises a signal splitter.

15. The system of claim 14, comprising at least one of:
a. a two-channel said second modular wiring harness connectable to said two-channel first modular wiring harness and connectable to a two-channel said amplifier;
b. a four-channel said second modular wiring harness connectable to said two-channel first modular wiring harness and connectable to a four-channel said amplifier, wherein, when connected, said signal processor is responsive to said four-channel amplifier to split said two-channel audio signals into four audio signals;
c. a five-channel said second modular wiring harness connectable to said two-channel first modular wiring harness and connectable to a five-channel said amplifier, wherein, when connected, said signal processor is responsive to said five-channel amplifier to split said two-channel audio signals into five audio signals; and
d. a six-channel said second modular wiring harness connectable to said two-channel first modular wiring harness and connectable to a six-channel said amplifier, wherein, when connected, said signal processor is responsive to said six-channel amplifier to split said two-channel audio signals into six audio signals.

16. The system of claim 13, comprising:
a. a first modular wiring harness comprising:
  i. two complimentary second audio signal wire connector portions coupled to first and second audio signal wires that are further routed into a first ferrule, enclosed in a cable, and coupled to a male ten-pin connector portion; and
  ii. a remote-in signal wire that is connectable to said two-channel audio source that extends into said first ferrule, is enclosed in said cable, and is coupled to said male ten-pin connector portion; and
b. a second modular wiring harness comprising:
  i. a complimentary female ten-pin connector coupled to a second cable;
  ii. said second cable extending from said female ten-pin connector and terminating in a second ferrule; and
  iii. six wires extending from said second ferrule further comprising:
    1. two audio signal wires;
    2. an audio ground wire;
    3. a +12 VDC wire;
    4. a ground wire for said +12 VDC; and
    5. a remote-in signal wire.

17. The system of claim 13, comprising:
a. a first modular wiring harness comprising:
  i. four complimentary second audio signal wire connector portions coupled to first, second, third, and fourth audio signal wires that are further routed into a first ferrule, enclosed in a cable, and coupled to a male ten-pin connector portion; and
  ii. a remote-in signal wire extending from said four-channel audio source that is further routed into said ferrule, enclosed in said cable, and coupled to said male ten-pin connector portion; and
b. a second modular wiring harness comprising:
  i. a complimentary female ten-pin connector coupled to a second cable;
  ii. said second cable extending from said female ten-pin connector and terminating in a second ferrule; and
  iii. eight wires extending from said second ferrule further comprising:
    1. four audio signal wires;
    2. an audio ground wire;
    3. a +12 VDC wire;
    4. a ground wire for said +12 VDC; and
    5. a remote-in signal wire.

18. The system of claim 13, comprising:
a. a first modular wiring harness comprising:
  i. five complimentary second audio signal wire connector portions coupled to first, second, third, fourth, and fifth, audio signal wires that are further routed into a first ferrule, enclosed in a cable, and coupled to a male ten-pin connector portion; and
  ii. a remote-in signal wire connectable to a five-channel said audio source that is further routed into said first ferrule, enclosed in said cable, and coupled to said male ten-pin connector portion; and
b. a second modular wiring harness comprising:
  i. a complimentary female ten-pin connector coupled to a second cable;
  ii. said second cable terminating in a second ferrule; and
  iii. ten wires extending from said second ferrule further comprising:
    1. five audio signal wires;
    2. an audio ground wire;
    3. a +12 VDC wire;
    4. a ground wire for said +12 VDC; and
    5. a remote-in signal wire.

19. The system of claim 13, comprising:
a. a first modular wiring harness comprising:
  i. six complimentary second audio signal wire connector portions coupled to first, second, third, fourth, fifth, and sixth audio signal wires that are further routed into a first ferrule, enclosed in a cable, and coupled to a male ten-pin connector portion; and
  ii. a remote-in signal wire, extending from a six-channel said audio source, that is further routed into said first ferrule, enclosed in said cable, and coupled to said male ten-pin connector portion; and
b. a second modular wiring harness comprising:
  i. a complimentary female ten-pin connector coupled to a second cable;
  ii. said second cable terminating in a second ferrule; and
  iii. ten wires extending from said second ferrule further comprising:
    1. six audio signal wires;
    2. an audio ground wire;
    3. a +12 VDC wire;
    4. a ground wire for said +12 VDC; and
    5. a remote-in signal wire.

20. A modular multichannel audio connection system comprising:
a. a first modular wiring harness connectable to a source of audio signals;
b. a second modular wiring harness:
  i. connectable to said first modular wiring harness; and
  ii. connectable to an amplifier;
c. an extension cable connectable between said first modular wiring harness and said second modular wiring harness, wherein said extension cable has a ten-pin female connector portion on a first end and a ten-pin male connector portion on an opposing second end;
d. wherein, said first and second modular wiring harnesses, when connected together and to said source of audio signals and to said amplifier, respectively, said first and second modular harnesses are configured to provide electrical power from said amplifier to said source of audio signals and are operable to be the sole conduit of electrical power to said source of audio signals;
e. wherein said first modular wiring harness and said second modular wiring harness are connectable via a ten-pin male connector portion on said first modular wiring harness and a complimentary ten-socket female connector portion on said second modular wiring harness; and
f. wherein said first and second harnesses, when connected together and to said source of audio signals and to said amplifier, respectively, comprise a remote-in signal path from said source of audio signals to said amplifier.

21. The system of claim 20, comprising:
 a. a two-channel first modular wiring harness comprising a signal processor that comprises a signal splitter; and
 b. at least one of:
  i. a two-channel said second modular wiring harness connectable to said two-channel first modular wiring harness and connectable to a two-channel said amplifier;
  ii. a four-channel said second modular wiring harness connectable to said two-channel first modular wiring harness and connectable to a four-channel said amplifier, wherein said signal processor is responsive to said four-channel amplifier, when connected, to split said two-channel audio signals into four audio signals;
  iii. a five-channel said second modular wiring harness connectable to said two-channel first modular wiring harness and to a five-channel said amplifier, wherein said signal processor, when connected, is responsive to said five-channel amplifier to split said two-channel audio signals into six audio signals; and
  iv. a six-channel said second modular wiring harness connectable to said two-channel first modular wiring harness and connectable to a six-channel said amplifier, wherein said signal processor is responsive, when connected, to said six-channel amplifier, to split said two-channel audio signals into six audio signals.

22. The system of claim 20, comprising:
 a. a two-channel subsystem comprising:
  i. a first modular wiring harness comprising:
   1. two complimentary second audio signal wire connector portions coupled to first and second audio signal wires that are further routed into a first ferrule, enclosed in a cable, and coupled to a male ten-pin connector portion; and
   2. a remote-in signal wire connectable to said two-channel audio source that is further routed into said first ferrule, enclosed in said cable, and coupled to said male ten-pin connector portion; and
  ii. a second modular wiring harness comprising:
   1. a complimentary female ten-pin connector coupled to a second cable;
   2. said second cable extending from said female ten-pin connector and terminating in a second ferrule; and
   3. six wires extending from said second ferrule further comprising:
    a. two audio signal wires;
    b. an audio ground wire;
    c. a +12 VDC wire;
    d. a ground wire for said +12 VDC; and
    e. a remote-in signal wire;
 b. a four-channel subsystem comprising:
  i. a first modular wiring harness comprising:
   1. four complimentary second audio signal wire connector portions coupled to first, second, third, and fourth audio signal wires that are further routed into a first ferrule, enclosed in a cable, and coupled to a male ten-pin connector portion; and
   2. a remote-in signal wire connectable to said four-channel audio source that is further routed into said first ferrule, enclosed in said cable, and coupled to said male ten-pin connector portion; and
  ii. a second modular wiring harness comprising:
   1. a complimentary female ten-socket connector coupled to a second cable;
   2. said second cable extending from said female ten-pin connector and terminating in a second ferrule; and
   3. eight wires extending from said ferrule further comprising:
    a. four audio signal wires;
    b. an audio ground wire;
    c. a +12 VDC wire;
    d. a ground wire for said +12 VDC; and
    e. a remote-in signal wire;
 c. a five-channel subsystem comprising:
  i. a first modular wiring harness comprising:
   1. five complimentary second audio signal wire connector portions coupled to first, second, third, fourth, fifth, and sixth audio signal wires that are further routed into a first ferrule, enclosed in a cable, and coupled to a male ten-pin connector portion; and
   2. a remote-in signal wire extending from said two-channel audio source that is further routed into said first ferrule, enclosed in said cable, and coupled to said male ten-pin connector portion; and
  ii. a second modular wiring harness comprising:
   1. a complimentary female ten-socket connector coupled to a second cable;
   2. said second cable extending from said female ten-pin connector and terminating in a second ferrule; and
   3. nine wires extending from said second ferrule further comprising:
    a. five audio signal wires;
    b. an audio ground wire;
    c. a +12 VDC wire;
    d. a ground wire for said +12 VDC; and
    e. a remote-in signal wire; and
 d. a six-channel subsystem comprising:
  i. a first modular wiring harness comprising:
   1. six complimentary second audio signal wire connector portions coupled to first, second, third, fourth, fifth, and sixth audio signal wires that are further routed into a first ferrule, enclosed in a cable, and coupled to a male ten-pin connector portion; and
   2. a remote-in signal wire extending from said two-channel audio source that is further routed into said first ferrule, enclosed in said cable, and coupled to said male ten-pin connector portion; and
  ii. a second modular wiring harness comprising:
   1. a complimentary female ten-socket connector coupled to a second cable;
   2. said second cable extending from said female ten-pin connector and terminating in a second ferrule; and
   3. ten wires extending from said second ferrule further comprising:
    a. six audio signal wires;
    b. an audio ground wire;
    c. a +12 VDC wire;
    d. a ground wire for said +12 VDC; and
    e. a remote-in signal wire.

* * * * *